United States Patent [19]

Carr et al.

[11] Patent Number: 5,438,740
[45] Date of Patent: Aug. 8, 1995

[54] RECONFIGURABLE FIXTURING PALLET FO RREGISTERING AND SUPPORTING MULTI-BOARD PANELS ON THE TABLE OF A PROGRAMMABLE ROUTING MACHINE

[75] Inventors: D. Patrick Carr, Longmont; Kurt J. Hill, Berthoud, both of Colo.

[73] Assignee: Cencorp, Inc., Longmont, Colo.

[21] Appl. No.: 202,976

[22] Filed: Feb. 28, 1994

[51] Int. Cl.⁶ .................... B23Q 7/14; B25B 5/00
[52] U.S. Cl. ............................ 29/33 P; 29/829;
158/345.3; 269/103; 409/220
[58] Field of Search ............... 29/33 P, 563, 705, 829,
29/791, 846; 269/903, 47; 83/451; 198/345.3,
346.1, 465.1; 409/219, 220, 218, 225

[56] References Cited

U.S. PATENT DOCUMENTS

| | | | |
|---|---|---|---|
| 3,930,644 | 1/1976 | Albert, Jr. | 269/903 X |
| 4,030,717 | 6/1977 | Serlovsky | 269/903 X |
| 4,291,867 | 9/1981 | Williams et al. | 269/903 X |
| 4,532,839 | 8/1985 | Easton | 83/451 X |
| 4,621,552 | 11/1986 | Lopez | 83/27 |
| 4,638,985 | 1/1987 | Maeda | 269/903 X |
| 4,683,789 | 8/1987 | Lopez | 83/35 |
| 4,742,615 | 5/1988 | Lopez | 409/132 X |
| 4,742,615 | 5/1988 | Lopez | 29/846 |
| 4,776,080 | 10/1988 | Christensen | 269/903 X |
| 4,791,721 | 12/1988 | Anderson et al. | 29/829 |
| 4,850,104 | 7/1989 | Matrone et al. | 29/705 X |
| 4,878,240 | 5/1989 | Longenecker et al. | 269/47 |
| 5,005,814 | 4/1991 | Gumbert | 269/903 X |
| 5,067,648 | 11/1991 | Cascini | 269/903 X |
| 5,067,695 | 11/1991 | Huddleston | 269/903 X |
| 5,084,952 | 2/1992 | Grabow | 29/33 P |
| 5,117,554 | 6/1992 | Grabow | 29/791 |
| 5,210,922 | 5/1993 | Carr | 29/791 X |

*Primary Examiner*—William Briggs
*Attorney, Agent, or Firm*—Banner, Birch, McKie & Beckett

[57] ABSTRACT

A fixturing pallet is removably registered on the table of a programmable routing machine and provides a platform to which tooling is registered and repositionably attached. The tooling is used according to registration, supporting, and routing requirements of each multi-board panel and its individual boards; and it serves to support and establish and maintain registration of each panel and/or board on the pallet during: (i) transporting of the multi-board panels from a load/unload station to the routing station, (ii) depaneling at the routing station, and (iii) transporting of liberated boards and scrap back to the load/unload station.

23 Claims, 9 Drawing Sheets

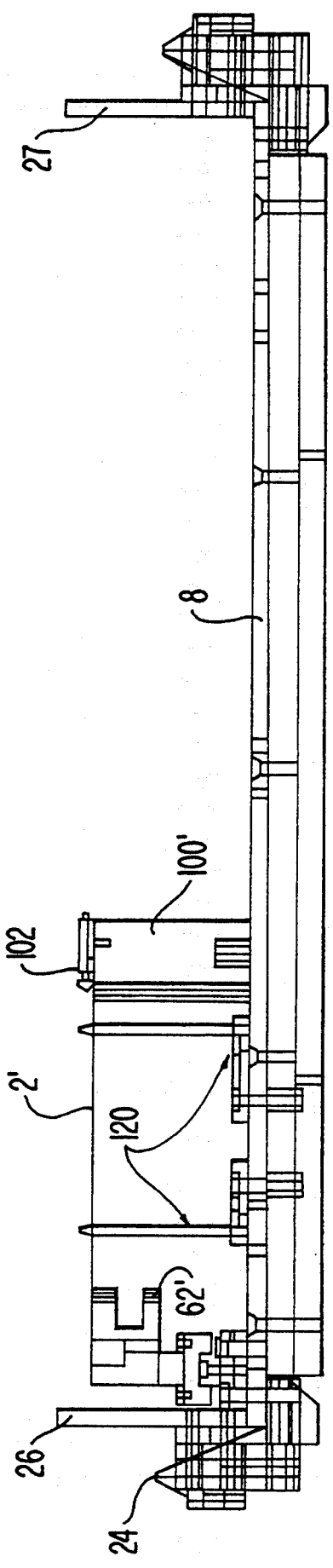

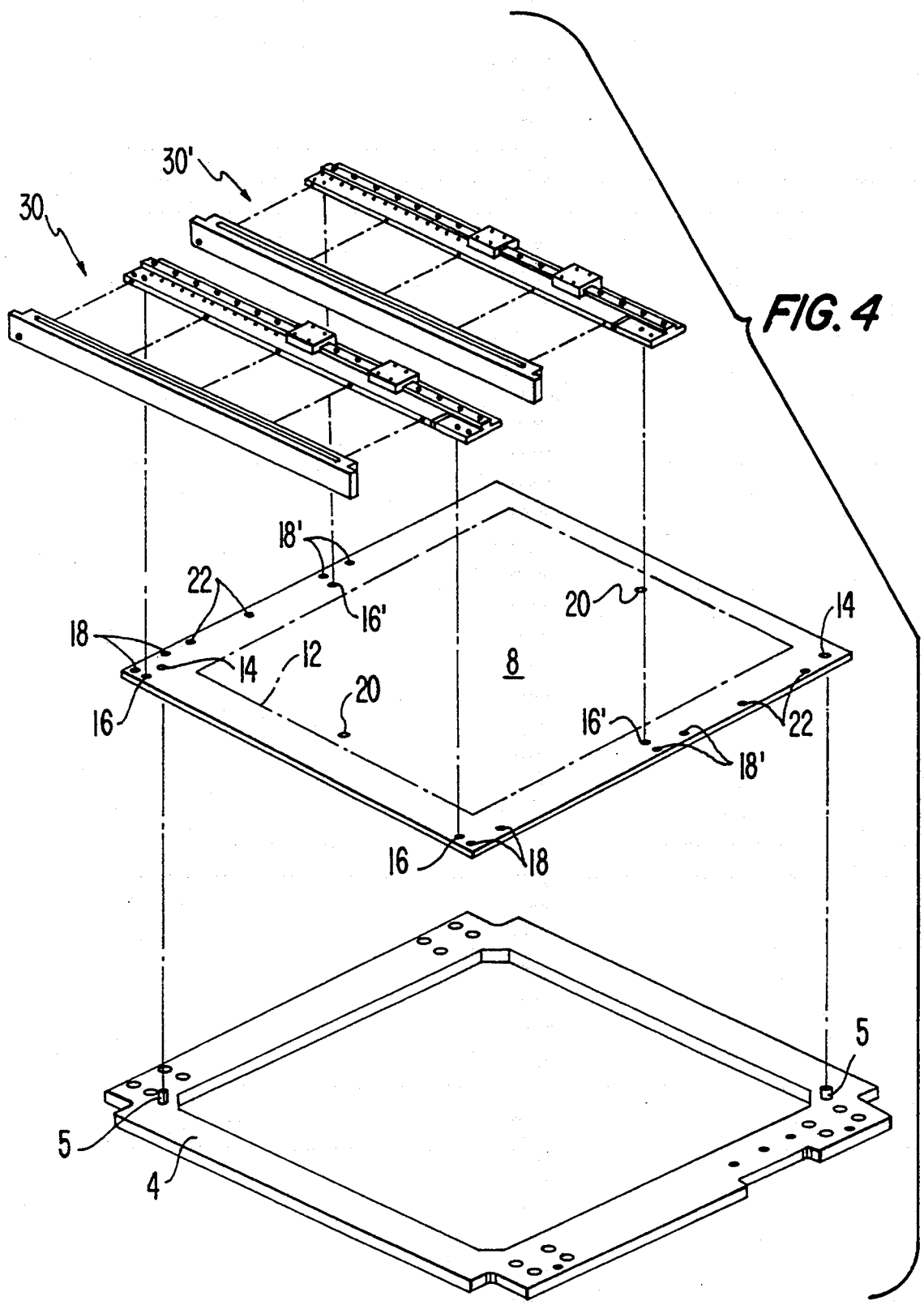

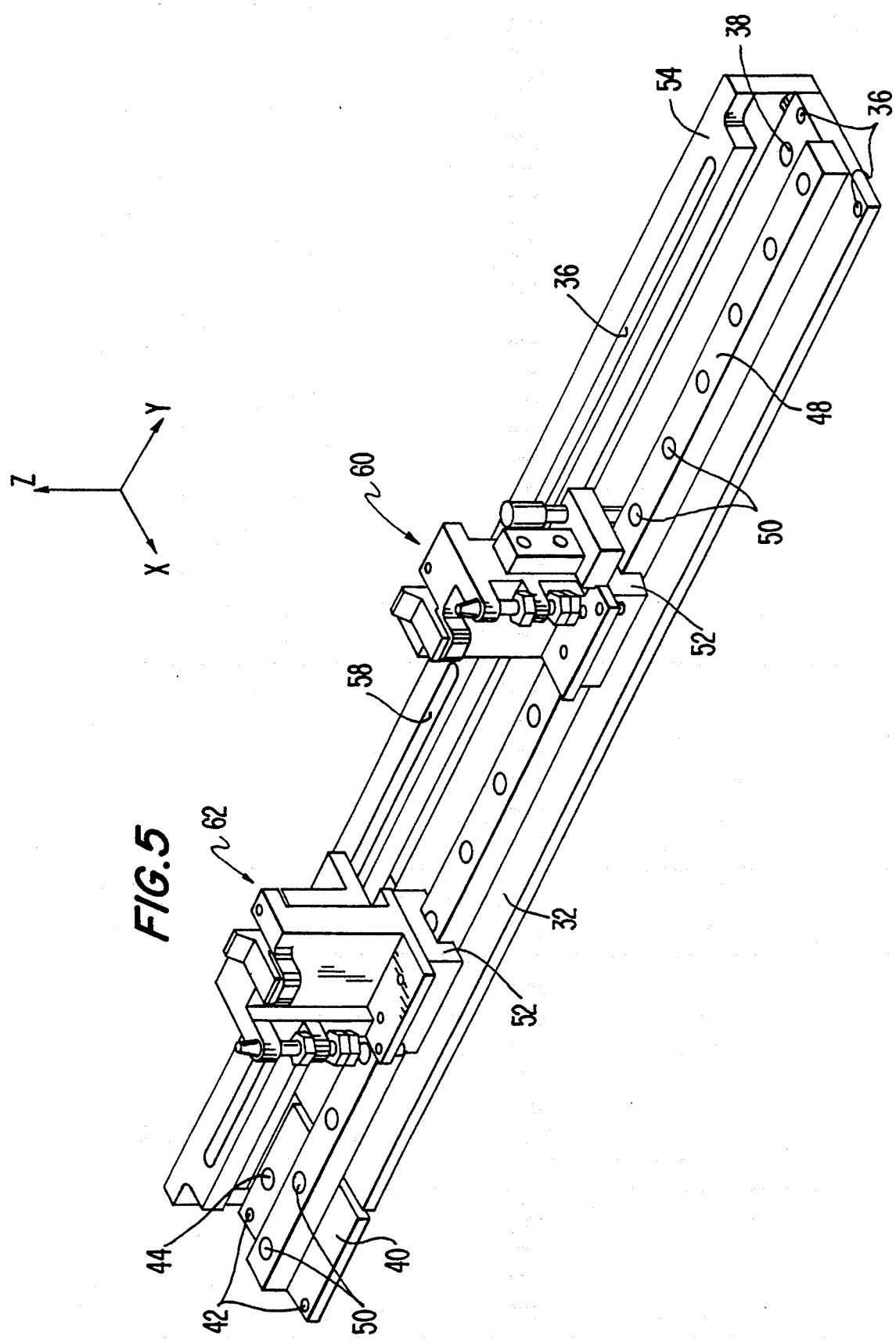

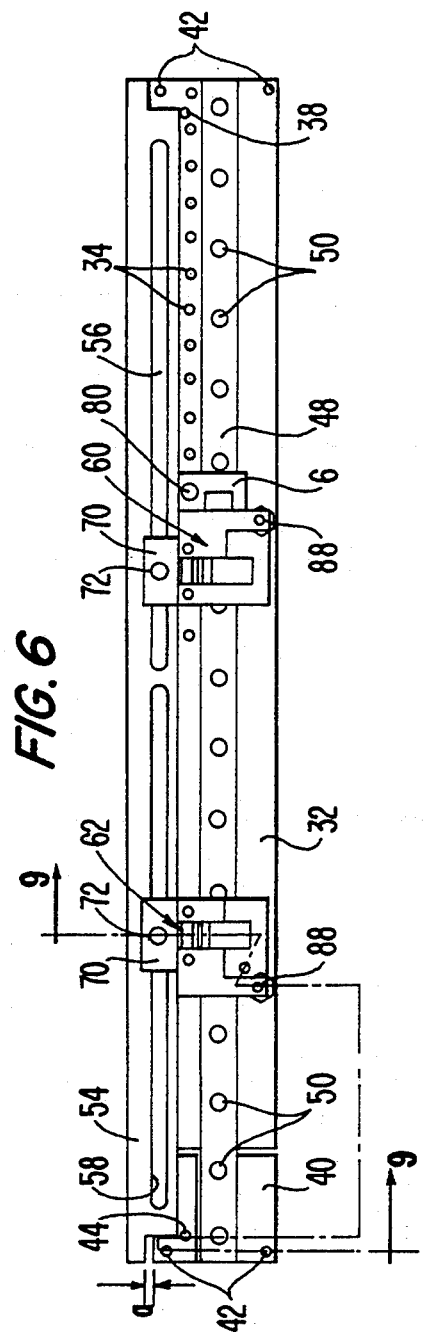
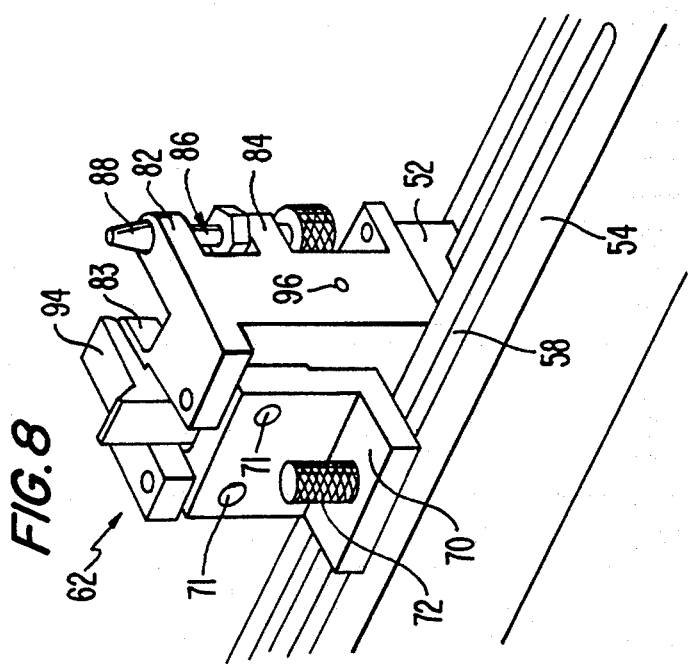
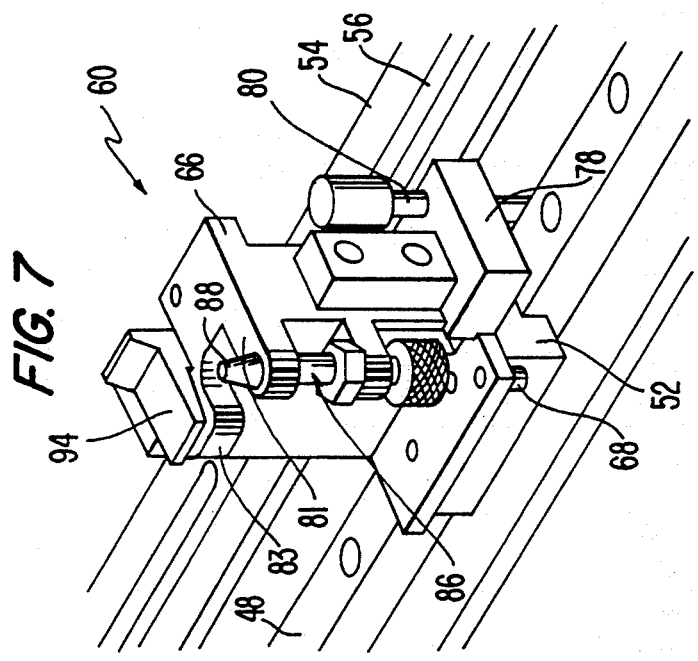

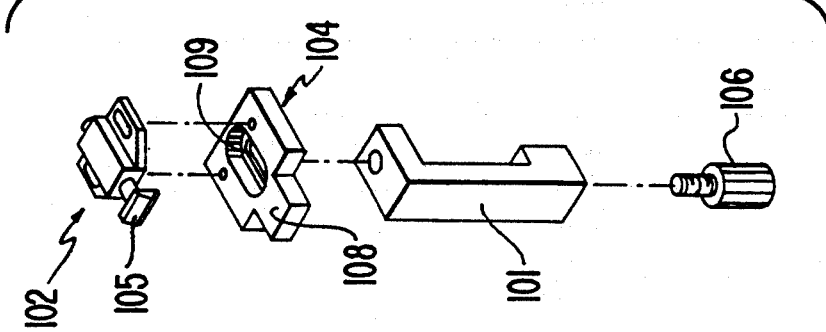
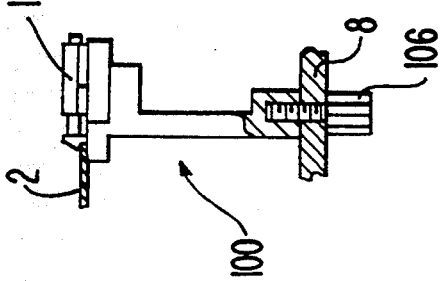
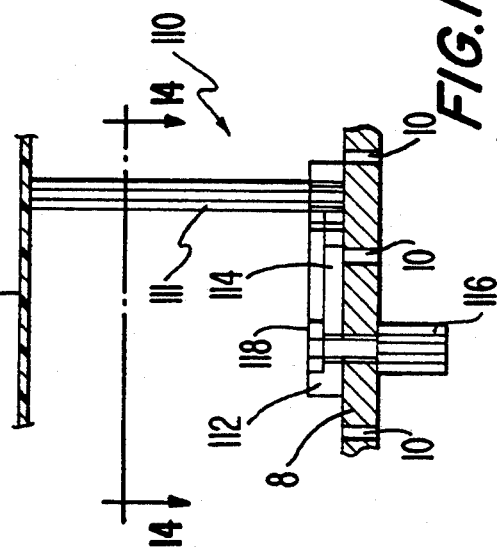
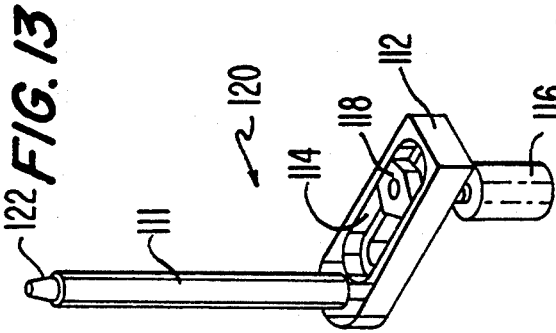
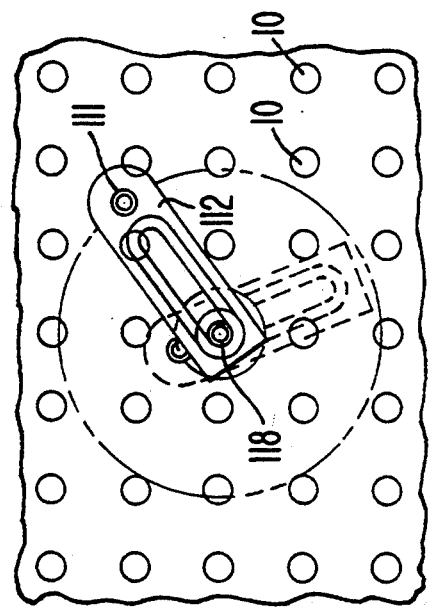

RECONFIGURABLE FIXTURING PALLET FOR REGISTERING AND SUPPORTING MULTI-BOARD PANELS ON THE TABLE OF A PROGRAMMABLE ROUTING MACHINE

PRIOR ART CROSS-REFERENCES

U.S. Pat. No. 4,621,552 to Gilbert T. LOPEZ, entitled METHOD AND APPARATUS FOR SEPARATING PRINTED-CIRCUIT BOARDS FROM MULTI-BOARD PANELS, issued Nov. 11, 1986.

U.S. Pat. No. 4,683,789 to Gilbert T. LOPEZ, entitled METHOD AND APPARATUS FOR SEPARATING PRINTED-CIRCUIT BOARDS FROM MULTI-BOARD PANELS, issued Aug. 4, 1987.

U.S. Pat. No. 4,742,615 to Gilbert T. LOPEZ, entitled ROUTING METHOD AND APPARATUS FOR CUTTING PRINTED CIRCUIT BOARDS, issued May 10, 1988.

U.S. Pat. No. 4,830,554 to Gilbert T. LOPEZ, entitled ROUTING METHOD AND APPARATUS FOR CUTTING PRINTED CIRCUIT BOARDS, issued May 16, 1989.

U.S. Pat. No. 5,084,952 to Glen M. GRABOW, entitled METHOD AND APPARATUS FOR INCREASING A SUBSTRATE PROCESSING AREA WITHOUT INCREASING THE LENGTH OF A MANUFACTURING LINE, issued Feb. 4, 1992.

U.S. Pat. No. 5,117,554 to Glen M. GRABOW, entitled TAB ROUTING METHOD AND APPARATUS, issued Jun. 2, 1992.

U.S. Pat. No. 5,210,922 to D. Patrick CARR, entitled ACQUIRING AND MAINTAINING SUPPORT FOR AND REGISTRATION WITH EACH BOARD DURING DEPANELING AND TRANSFERRING OF EACH LIBERATED BOARD TO A SUBSEQUENT STATION, issued May 18, 1993.

The disclosures of the prior art listed above hereby are incorporated by reference into the instant disclosure.

GLOSSARY OF TERMS

Board: an individual printed circuit board which may or may not already be populated with electrical components.

Multi-board (mother) panel: a panel of circuit board substrate material from which an array of boards are to be removed (depaneled) by routing. The periphery of each board may or may not have been partially routed previous to depaneling. The multi-board panel format facilitates automated handling and population of the individual boards.

Depanelization: a process of removing or liberating a board from a panel. Router depaneling utilizes a high speed spindle and cutting tool or bit in an end milling operation by which substrate material immediately surrounding the periphery of each board is removed.

Registration: recognition and referencing of the locations (in X,Y, and Z,) of particular features of a panel, board, and/or transporting pallet relative to a "home" position of a machine. Typically, full registration of a panel to the machine is accomplished by (i) registering the machine with a transport pallet via mating locator pins and holes and, in turn, registering the transport pallet with the panel/and or boards via other locator pins and holes, or (ii) using a vision system to find (recognize) fiducials or particular "landmarks" which are on the panel or board in order to reference the location of these features relative to the home position of the machine.

BACKGROUND OF THE INVENTION

The invention is in the field of substrate handling and deals with the handling of multi-board (mother) panels and individual printed circuit boards (hereafter referred to as boards) which are liberated or "depaneled" from each mother panel by a machine-mounted router which is displaceable in X, Y, and Z relative to the panel in order to accomplish the depaneling. The individual boards may have had little or no routing around their peripheries prior to handling by such a machine. Others of the panels may have been routed to an extent that only small tabs or webs of the substrate material remain to hold the boards in the panel with sufficient rigidity that they remain attached during automated population of the boards with electrical components. The latter type of panel generally is referred to in the industry as a slotted and webbed (or tabbed) array.

The individual boards generally are not designed with an eye toward automated handling of the boards once they are separated from the multi-board panel. Unlike the mother panel, the peripheries of individual boards vary widely in size and shape, and a different "routing path" is required for each different location and/or periphery of a board contained within the panel.

The invention is directed to a fixture on which the panels and/or circuit boards are registered and fixedly supported for transfer to and from the routing area of a programmed depaneling machine.

A typical prior art depaneling process utilizes a different prefabricated fixture for registering and supporting each differently profiled and/or configured panel or board to be liberated from the panel. Each fixture is placed, in turn, in a load/unload station of the machine, loaded with one or more panels by an operator, and transported by the machine to the routing area. Upon completion of the routing program, the fixture is returned by machine back to the load/unload station for removal of panels and liberated boards by the operator. If successive identical panels are to be processed, then the fixture is reloaded with the next identical panel. Otherwise, the fixture is removed from the machine and replaced with a fixture which has been fabricated specifically for handling the next panel to be processed.

This prior art requires that a separate and different "dedicated" fixture be designed, manufactured, and assembled for each differently profiled or configured panel or board to be routed, thus involving the use of engineering and manufacturing resources and the concurrent costs of employing these resources.

Thus, an object of this invention to provide a fixturing device which is readily reconfigurable in order to establish and maintain registered control of panels and/or the individual boards in preparation for, during, and after processing of a multi-board panel.

Also, it is an object of the invention to avoid the need for so-called "dedicated fixtures" by providing a fixturing pallet which has a platform and various manually adjustable tooling components which are removably mountable on the platform in order to provide different fixture configurations for registering and supporting a variety of panels.

Additionally, it is an object of the invention to provide a reconfigurable fixturing device having a platform on which a variety of tooling is removably attachable and adjustable in order to physically support each individual board as it is liberated from a panel and to retain registration between the machine and each board during the depaneling process.

Another object of the invention is to provide at least some of the registering and supporting tooling with vertically adjustable cone-shaped pins so that, by raising or lowering the cone-shaped pins, the same supporting component can be used with board registration holes of different sizes.

Still another object of the invention is to provide for easy and accurate adjustment of the lateral spacing between tooling of the fixture so as to facilitate reconfiguration of the fixturing pallet.

Further, it is an object of the invention to provide that the registration of the panel to the novel pallet and machine is easily and accurately repeatable in order to repeatably duplicate set-ups which have been used previously.

Still further, it is an object of the invention to provide a fixturing pallet which is easily and removably mountable and repeatably registerable on a moveable or fixed table, such as the table or surface of a shuttle on which fixtures are transported to and from the routing station of the machine.

Still another object of the invention is to provide a fixturing pallet which is capable of receiving and registering auxiliary, "dedicated" fixtures which have been prefabricated to support and register particular multi-board panels for processing by the routing machine.

Also, it is an object of the invention to provide a fixturing pallet and tooling with which a phenolic panel or the like is registerable to facilitate fabrication of such "dedicated" fixtures on the router machine.

These and other objects of the invention will become more apparent from the remaining disclosure.

BRIEF SUMMARY OF THE INVENTION

A fixturing pallet is removably registered on the table of a programmable routing machine and provides a platform to which tooling is registrateable and repositionably attachable. The tooling is used according to registration, supporting, and routing requirements of each multi-board panel and its individual boards; and it serves to support and establish and maintain registration of each panel and/or board on the pallet during: (i) transporting of the multi-board panels from a load/unload station to the routing station, (ii) depaneling at the routing station, and (iii) transporting of liberated boards and scrap back to the load/unload station.

BRIEF DESCRIPTION OF THE DRAWINGS

FIG. 3 is a right side elevation of the device of FIG. 2.

FIG. 4 is an exploded isometric view of a portion of another embodiment of the fixturing pallet, illustrating the locations of various holes in the pallet platform which are used for registering it on the table and for registering and attaching tool supporting bar assemblies on the platform.

FIG. 5 is an isometric view of repositionable registration tooling and the bar assembly which supports the tooling.

FIG. 6 is a top plan view of the device of FIG. 5.

FIG. 7 is an enlarged, isometric view of a portion of FIG. 5 for illustrating a registration tooling of the inventive fixturing pallet.

FIG. 8 is an enlarged, isometric view of the opposite side of another portion of FIG. 5 for illustrating another registration tooling of the inventive fixturing pallet.

FIG. 10 is an isometric view of tooling of the invention which is used for gripping the edge of the panel.

FIG. 11 is a side elevational view, partially in cross-section, of the device of FIG. 10 mounted on the perforated platform or plate of the inventive pallet while clamping the edge of a panel.

FIG. 12 is a side elevational view, partially in cross-section, of tooling of the invention which is mounted on the perforated platform or plate of the inventive pallet and used for supporting a mid-portion of a panel and/or board.

FIG. 13 is an isometric view of tooling which, except for a tapered tip extension, is identical to the tooling of FIG. 12.

FIG. 14 is an enlarged top plan view, partially in cross-section, as viewed generally in the direction of arrows 14—14 of FIG. 12, for the purpose of illustrating the degree and means of adjustability of the tooling of FIGS. 12 and 13.

DETAILED DESCRIPTION OF THE INVENTION

Figure 1:
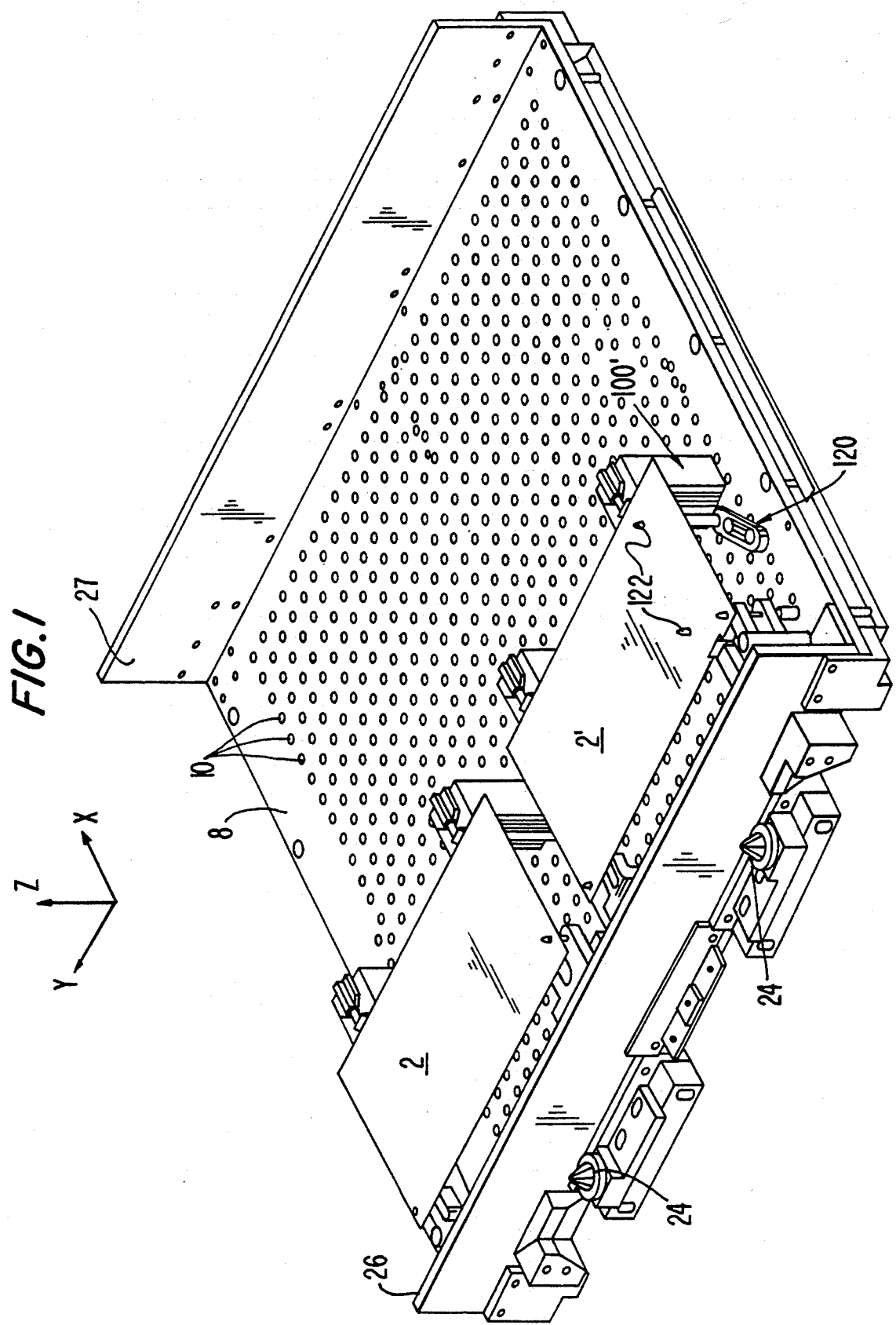
FIG. 1 is an isometric view of one embodiment of the fixturing pallet of the invention, and two multi-board panels registered and supported thereon.
Figure 2:
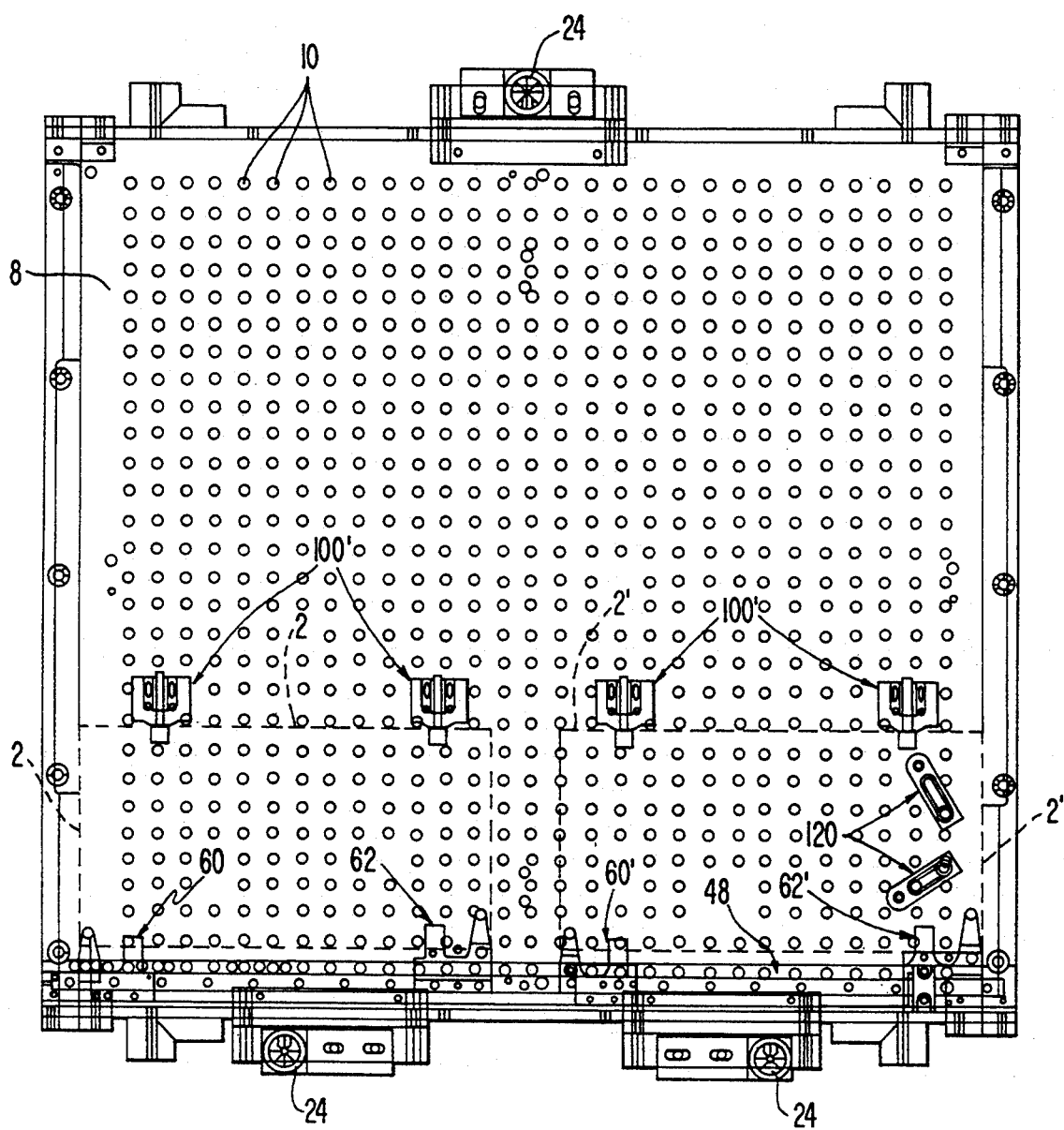
FIG. 2 is a plan view of the fixturing pallet illustrated in FIG. 1, with the multi-board panels being in phantom.

The reader's attention is directed to the similarities of the fixturing pallet illustrated in FIG. 4 with the fixturing pallet illustrated in FIGS. 1-3. The fixturing pallet of FIGS. 1-3 is substantially identical to that of FIG. 4, while having additional structural elements which enable registration and mounting of the pallet on the underside of a table of a board routing machine, whereas the pallet of FIG. 4 rests on and registers with the top surface of a table.

For example, in FIGS. 1-3, the pallet is adapted to be received on a pair of rails which are suspended below the shuttle table. Upon receiving the pallet, the rails are elevated to clamp the pallet to the underside of the table. The three cones 24 engage and self-center in corresponding holes in the table during the raising and clamping so as to register the pallet with the shuttle table and, thus, the machine. Front wall 26 and rear wall 27 are unnecessary to the operation of the pallet and are intended as a shield to prevent bumping of any panels or tooling mounted thereon during positioning of the pallet in, and removal of the pallet from, the machine by an operator.

Registration of the pallet in FIG. 4 to the table 4 of a machine is accomplished by engaging pins 5 of table 4 in holes 14 of platform or plate 8.

Except for these structural differences in registering the two pallets to machine shuttles, the remaining structure is found in both embodiments of the reconfigurable fixturing pallet and, thus, identical numbers are used for identical features in both embodiments. Referring to the drawings, each pallet has a platform or plate 8 with an array of holes 10 to facilitate the attachment of hardware by which printed circuit boards can be clamped to, supported on, and/or registered with the plate 8 at various locations on plate 8 and in various orientations.

In FIG. 4, only the outline 12 of the periphery of the array of holes 10 is indicated on platform 8 in order that the reader can clearly identify other specific holes and their purpose, as follows. Holes 16 in platform 8 are for mating with (as better seen in cross-section in FIG. 9) a corresponding pair of pins 38 and 44 of tooling supporting bar assembly 30 in order to register assembly 30 with platform 8. Holes 18 receive machine screws 42 which secure bar assembly 30 to platform 8. Holes 20 are for registration of standoffs 144 and 146 (FIG. 15) for a purpose that will be explained later. Holes 22 are for attachment of handles (not shown) to platform 8 so as to facilitate pallet placement on, and removal from, table 4 by an operator of the machine.

As illustrated in FIG. 4, an identical bar assembly 30' can be registered with the platform 8 at holes 16' and attached via holes 18', as needed, in order to register and support additional multi-board panels.

Referring to FIGS. 4–9, bar assembly 30 has a long mounting plate 32 and short mounting plate 40, with a slotted clamping rail 54 attached to long plate 32 and a linear way 48 attached to both plates 32 and 40 by countersunk machine screws 50. Bar assembly 30 also includes slides 52 to which tooling 60 and 62 are attachable by machine screws 64 so as to be slidably repositionable along the length of linear way 48.

Registration of bar assembly 30 with platform 8 is accomplished by inserting pins 38 and 44 at each end of bar assembly 30 into holes 16 (best seen in FIG. 4) of platform 8, and then securing assembly 30 to platform 8 by means of the four screws 42. Sometimes it may be necessary to "fine tune" the alignment of the pallet of the invention to the routing machine, for example, when using the pallet with a particular machine for the first time or if a slight change of alignment occurs between the fixed or movable (e.g., shuttle) table and mechanisms with which it cooperates at the routing station. The particular structure of bar assembly 30 provides that any unacceptable tolerances in alignment of the bar assembly 30 with the routing machine can be "fine tuned" after the pallet is mounted on the table 4 of the machine.

For instance, sufficient "sloppiness" is provided at the connection between short plate 40 and linear way 48 by screws 50 and at the connection of both plates 32 and 40 to the platform 8 by screws 42. Thus, upon registering bar assembly 30 with platform 8 via registration pins 38 and 44 and loosening the two screws 50 and the four screws 42, the long plate 32 is slightly pivotal about registration pin 38 in order to finely align linear way 48 to the machine as needed, whereupon the loosened screws are tightened to maintain the adjustment.

Figure 9:
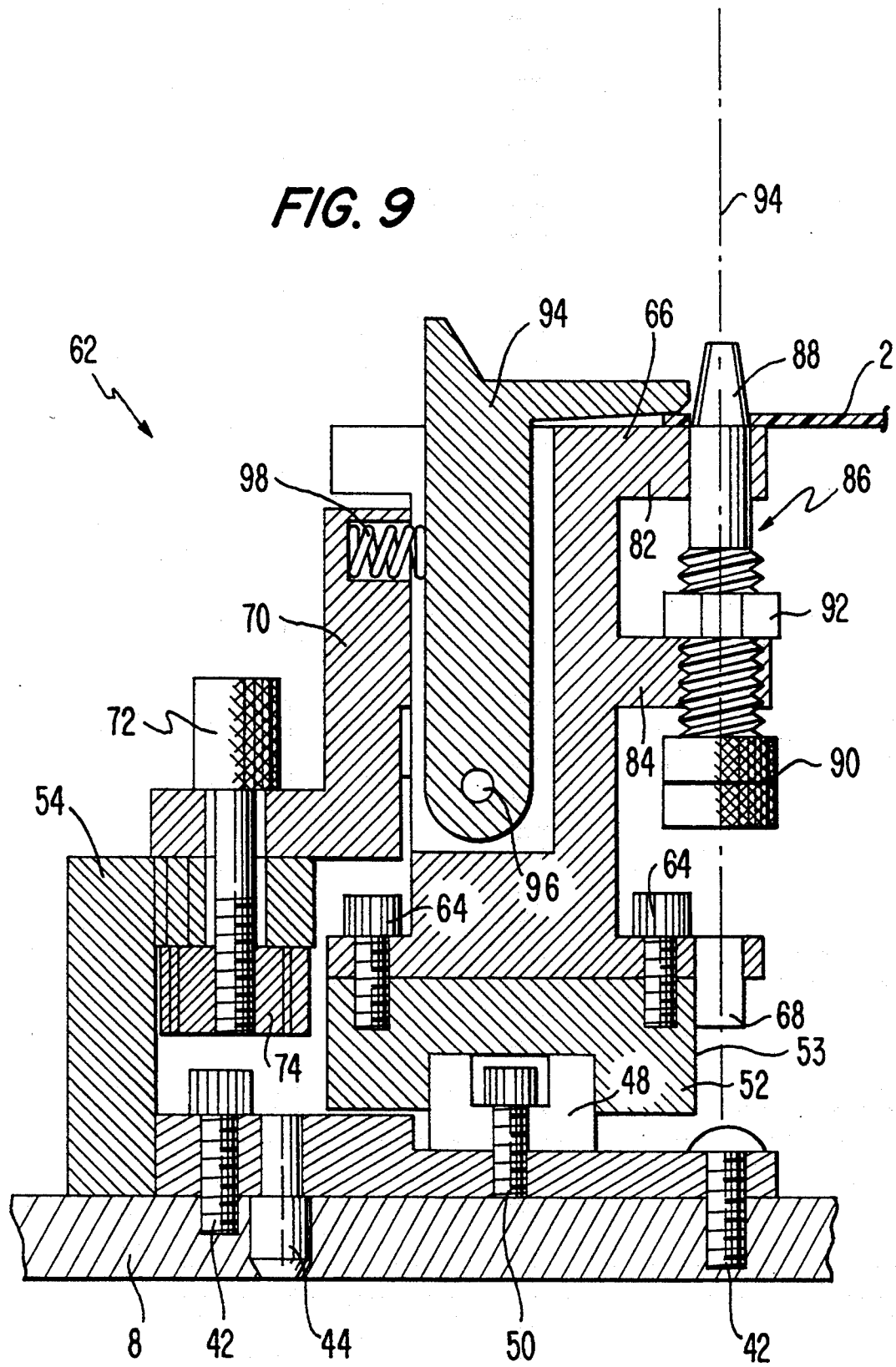
FIG. 9 is a cross-section as viewed generally in the direction of arrows 9—9 of FIG. 6.

As noted above, guide rail 54 is attached to long plate 32, but not to short plate 40, so that provision of a clearance "a" between these two members (FIG. 6), allows the long plate 32 to be rotated in either direction about pin 38 for the adjustment. Also, upon slidably positioning tooling 60 and 62 at selected, spaced locations along linear way 48, each can be maintained in the selected position by hand tightening the clamp screw 72 and nut 74 onto rail 54 (FIG. 9).

Long mounting plate 32 also is provided with a series of holes 34 into which a vertically reciprocatable pin 80 (FIG. 7) can be inserted so as to provide for repeatable registration of tooling 60 at selected positions along linear way 48. This is particularly useful and efficient when it is necessary to reconfigure the pallet for machine routing of a panel 2 according to a previously used program. Then, with tooling 60 registered, tooling 62 is slid along linear way 48 and spaced from tooling 60 by an amount which is appropriate to the panel to be routed, whereupon it is clamped to rail 54.

As is discernable from the drawings, tooling 62 mirrors tooling 60, except for pin 80 and its supporting bracket 78, so that they can cooperate in supporting and clamping an edge of a panel 2 while maintaining registration with the panel at opposite ends of that edge. Since tooling 60 and 62 otherwise are the same and the component parts of each serve the same function, the same numbers have been assigned to like-functioning parts of this tooling.

Each tooling 60 and 62 has a main body 66 which is attachable to one of the slides 52 by machine screws 64. Bracket 70, supporting clamp screw 72, is attached to a front face (as viewed in FIG. 8) of body 66 by screws 71. Protruding laterally from the rear face of body 66 are top arms 82 and 83 which have top surfaces for supporting a panel 2.

A clamping finger 94 cooperates with the top surface of arm 83 to clamp the edge of panel 2 thereto. Finger 94 is pivotally attached to body 66 by pin 96 (FIG. 9) and is spring biased to the panel edge clamping position by a compression spring 98 which is received in a recess of bracket 70.

Bottom arm 84 also protrudes laterally from the rear face of body 66 and threadably receives a registration pin 86 which is vertically telescopic through upper arm 82. Knurled knob 90 facilitates threaded adjustment of pin 86 up and down, and lock nut 92 provides a means of holding the adjusted position. The tip 88 of pin 86 is conically tapered so that, by such up and down adjustment, it can be raised or lowered in order to fit it to panel registration holes of various diameters.

In a prototype of the invention, panel 2 was tilted at about 85 degrees to the top surface of arm 82, while pushing finger 94 oppositely of the bias of spring 98, in order to register the panel on the tip 88 of pin 86. Of course, the threaded attachment of pin 86 to the lower arm 84 allows lowering of the pin to accomplish the panel registration.

A dowel pin 68 (FIG. 9) is attached to body 66 so as to be coaxial with registration pin 86 on common axis 94. This dowel pin is abutted against a reference surface 53 during attachment of body 66 to slide 52 in order to ensure proper locating of pin 86 (and hence the edge of panel 2) relative to the linear way 48.

The panel edge which is opposite of that held by tooling 60 and 62 is supported and maintained in location by tooling 100 (FIGS. 10 and 11). Tooling 100 has a main column 101 on top of which a bracket 104 is mounted. Bracket 104 has an oblong slot 109 with a surrounding edge which is recessed in the top surface of bracket 104 so as to receive the head of a screw (not shown) for attaching bracket 104 to column 101. This slotted attachment allows lateral adjustment of bracket 104 in order to properly position surface area 108 for under-edge support of a panel 2 (in the manner indicated by tooling 100' in FIG. 3). Atop the bracket 104 is mounted a spring clip device 102 having a plunger 105 which is spring biased toward the edge of the panel 2. Prototype tooling 100' illustrated in FIGS. 1–3, served the same purpose and operated in the same way as tooling 100 but was replaced thereby in order to minimize the weight of the reconfigurable pallet.

Where necessary, intermediate areas of the panel can be supported by the tooling 110 and 120 illustrated in FIGS. 12-14. This tooling has a vertical post 111, the bottom of which is threaded or otherwise attached to base member 112. Base member 112 has an oblong, recessed slot for receiving a nut 118 which, in turn, is for receiving the threaded shank of thumbscrew 116.

Thus, the tooling 110 and 120 is repositionably attachable in any of the holes 10 in platform 8 and clampable in a selected position by tightening the thumbscrew 116. As indicated in phantom in FIG. 14, the base member 112 can be slid and pivoted to selectively locate post 111 at a large number of places within the indicated circle. Tooling 120 differs from tooling 110 only by the addition of conically shaped tip 122 at the top of post 111. Tip 122 is positioned to mate in a hole which is already provided in panel 2, as best seen in FIGS. 1 and 3.

Each circuit board which is not individually supported and maintained in location relative to its socalled mother panel 2, during the depaneling operation, is far more likely to be pitched into the routing bit or to be pulled into it by the dynamics of the cutting forces. Further, the router bit itself can be destroyed by the undesired motion of boards which are liberated or nearly liberated. Still further, the vacuum applied to the routing area for removal of debris can act to dislodge boards which are not individually and properly supported and location-maintained.

Thus, the tooling 110 and 120 also is provided particularly for avoiding such a possibility by repositionably and adjustably supporting and maintaining the relative locations of the individual boards (and/or scrap pieces of the mother panel 2) before, during, and after the routing operation.

As seen in FIGS. 1-3, additional tooling 60' and 62' can be mounted on the linear way 48 of the reconfigurable fixturing pallet so as to cooperate with other additional tooling 110 and 120 in registering and supporting another panel 2'. As indicated above with regard to FIG. 4, an additional bar assembly 30' also can be registered and attached to platform 8, so that still more panels to be can be registered and supported on the same platform 8 for depaneling by the programmable machine's router.

Thus, fabrication of a dedicated fixture for each panel that requires a different fixturing configuration can be accomplished by just reconfiguring the fixturing pallet of the invention to accommodate the requirements for depaneling each panel.

Clearly, as the particular features of the invention have been described above, the time and care required for reconfiguring the novel pallet to handle different panel and/or board configurations is minimized. However, for different processing runs of short duration or runs requiring frequent reconfiguration of the novel pallet for a particular panel and/or board configuration and routing path, it may be desirable to further reduce the required changeover time by using an auxiliary "dedicated" fixture. For these cases, the reconfigurable pallet of the invention also is particularly adapted for fabricating, as well as registering and supporting, auxiliary dedicated fixtures on the routing machine.

Figure 15:
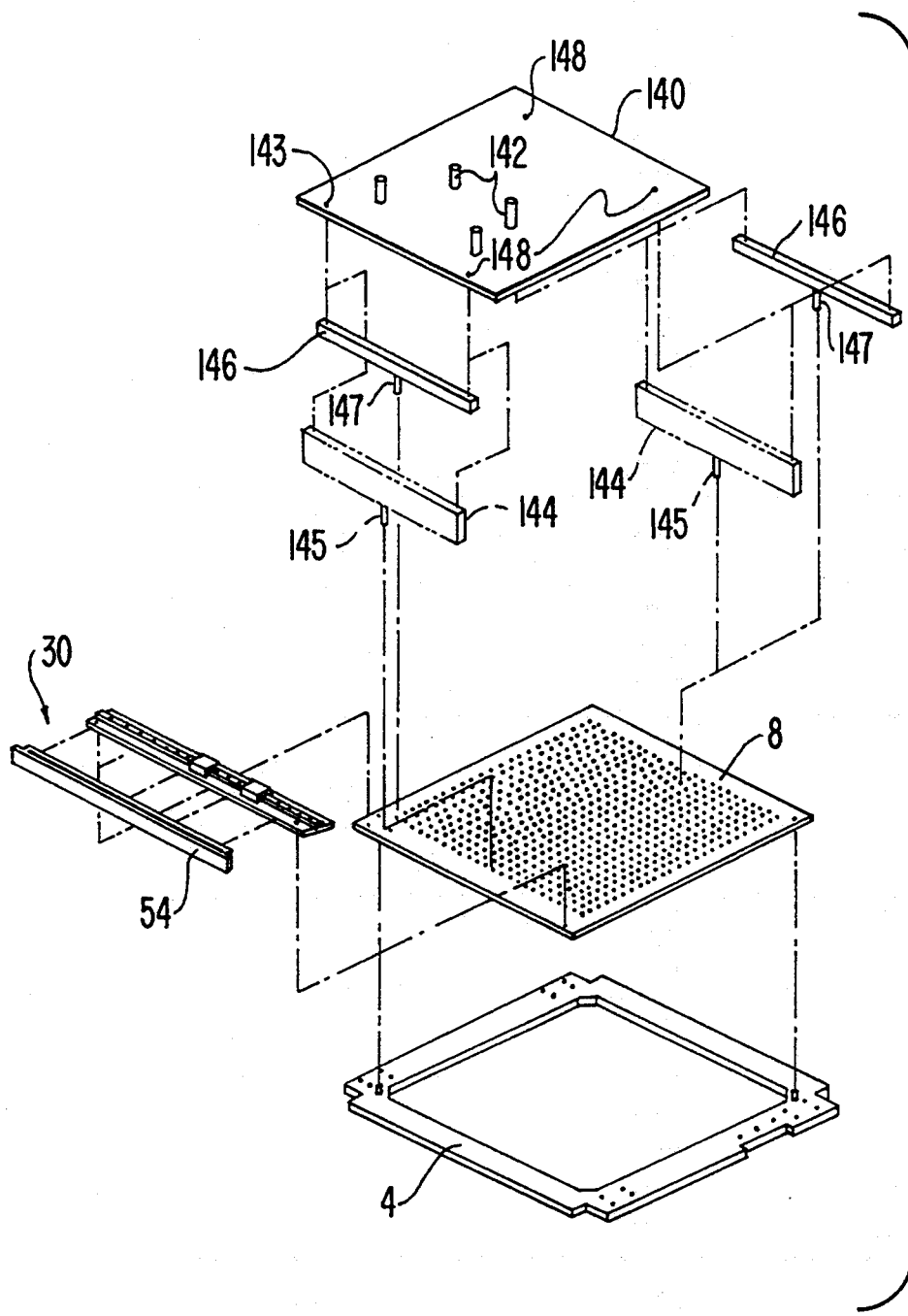
FIG. 15 is an exploded isometric view of the inventive fixturing pallet as it applies to fabrication of and use with dedicated tooling.

For instance, with reference to FIG. 15, a sheet 140 of phenolic material can be attached to high standoffs 144 which have pins 145 for registering with holes 20 (best seen in FIG. 4) of platform 8. Standoffs 144 position the sheet 140 at the appropriate height at which a drill bit (not shown) mounted in the routing machine's spindle can be used to drill holes, at selected locations in the phenolic sheet 140. After drilling these holes, the high (drilling) standoffs 144 are replaced with low (routing) standoffs 146 and dedicated pins 142 are mounted in the drilled holes to support and/or register a particular panel at the appropriate height for depaneling.

Bar assembly 30 and tooling 60 and 62 also can be used to register a panel 2 as a template for "teaching" or subprogramming a lateral shift for a particular machine-resident program for routing a particular panel. By so doing, that particular program can be used with an auxiliary fixture that is (i) dedicated to the particular panel, (ii) is "piggy-backed" on the pallet of the invention, and (iii) is used in a production run without using tooling 60 and 62.

For instance, with proper lateral spacing between tooling 60, 62 and the front edge of sheet 140 and standoff 146 of a dedicated prefabricated fixture (fabricated with or without use of the pallet of the invention), bar assembly 30 and tooling 60 and 62 can be used for efficient, "fine tunable" registering of the panel and piggy-backed fixture with the machine. In this way also, routing with the dedicated fixture "piggy backed" on the reconfigurable pallet can be performed with or without tooling 60 and 62 or standoffs 146.

If using one or more of the standoffs 146 with the tooling 60 and 62, it will be necessary to provide sufficient clearance between screws 148 and the corresponding holes in piece 140 so that, when screws 148 are loose, sheet 140 will be slightly shiftable relative to the standoffs during fine tuning of the linear rail 48 to the machine in the manner described earlier. This slight shifting of the sheet 140 relative to the standoffs allows visual alignment and mating of pins 142 with the panel they are to support.

A prototype of the reconfigurable fixturing pallet has been used on a routing machine having an IBM/XT compatible unit which stores programs which coordinate the machine operations, provides diagnostic status information, and provides for on-line programming.

Thus, it may be seen that the objects set forth above, along with those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

For example, it is contemplated that adjustable positioning of tooling 100 (FIGS. 10 and 11) to support the edge of a panel 2 could be accomplished by proving it with a base member 112 as in FIGS. 12-14. Additionally, color-code matching can be provided, between the various registration pins and attachment screws with the corresponding holes in which they are received, in order to simplify changeovers for an operator.

The following claims are intended to cover all of the generic and specific features of the invention herein described, and all statements of the scope of the invention which, as a matter of language, might be said to fall therebetween.

We claim:

1. In a fixture having means for registering said fixture to a programmable machine and means for registering and supporting at least one mother panel of substrate material on said fixture for at least partial removal of at least one circuit board from said panel, said removal being performed by a router bit mounted on a spindle of said machine, and said spindle being moveable in X, Y, and Z relative to said panel along a routing path according to a program, the improvement comprising:

a platform, said platform having a surface with an array of perforations therein;

said mother panel to fixture registering and supporting means comprising tooling means, adjustably repositionable over a surface of said platform, for reconfiguring said fixture to various different mother panels requiring correspondingly different programs and routing paths, said tooling means comprising at least one tool post means for supporting said panel in parallel, spaced relation to said platform surface;

connecting means, receivable into said perforations, for connecting said tool post means selectably at different locations on said surface of said platform according to requirements for each panel to be processed; and said tool post means comprising a linear way having means for registering said linear way to said platforms, and at least one sliding tool post which is mountable on and slidably repositionable along said linear way.

2. The improvement as in claim 1, said at least one tool post means is a first tool post means; said tooling means further comprising a second tool post means spaced from said first tool post means for supporting said panel in parallel, spaced relation to said platform surface; said second tool post means comprising:

a tool support post, and second connecting means, receivable into said perforations, for connecting said second tool post means to said surface of said platform according to requirements for each panel to be processed.

3. The improvement as in claim 2, wherein said second tool post means includes a surface parallel to said surface of said platform for supporting said panel adjacent an edge portion of said panel; and a plunger engageable with said an edge adjacent said edge portion of said panel, said plunger spring biased toward said edge of said panel.

4. The improvement as in claim 1, and further comprising:

means for repeatably reregistering said sliding tool post with said linear way at predefined locations along said linear way and according to corresponding predefined programs for control of said machine.

5. The improvement as in claim 1, and further comprising:

means for clamping said sliding tool post at selected locations along said linear way.

6. The improvement as in claim 3, and said sliding tool post further comprising:

pin means, capable of mating with a corresponding hole in said panel, for registering said panel with said sliding tool post.

7. The improvement as in claim 6, wherein said pin means comprises:

a pin having a tapered tip and being adjustable along a longitudinal axis of said pin in order to position said tip for registering different portions of said tip with corresponding panel registration holes of different diameters without changing said spaced relation of said panel from said platform surface.

8. The improvement as in claim 3, and said sliding tool post further comprising:

panel clamping means for clamping said panel and maintaining registration thereof with said sliding tool post.

9. The improvement as in claim 8, and said clamping means comprising:

a surface for receiving one face of an edge portion of said panel; and a finger engageable with an opposite face of said panel so as to clamp said panel between said finger and said surface.

10. The improvement as in claim 9, and further comprising:

said finger being spring biased into contact with said opposite face in order to effect said clamping.

11. The improvement as in claim 3, and further comprising:

means for fine tuning alignment of said linear way to a control axis of said machine.

12. The improvement as in claim 11, wherein said fine tuning means comprises:

means for attaching said linear way to each of two mounting plates;

said means for registering said linear way to said platform comprising a plate pin on each of said mounting plates for mating in a corresponding registration hole in said platform; and means for securing each of said mounting plates to said platform;

whereby, upon loosening said attaching means for at least one of said mounting plates and loosening all of said securing means, at least one of said plates is pivotable about a corresponding plate pin in order to slightly realign said linear way to an adjusted position, after which said attaching and securing means are tightened sufficiently to maintain said adjusted position of realignment.

13. The improvement as in claim 1, wherein said means for registering said fixture to said machine comprises:

a table of said machine; and means for registering said platform with said table.

14. The improvement as in claim 13, and further comprising:

said table being on a means for shuttling said fixture between a load/unload station and a routing station of said machine.

15. The improvement as in claim 9, and said tooling means further comprising a second tool post means, said second tool post means comprising:

a tool post having a flat surface for supporting said panel at an opposite edge portion; and spring clip means for maintaining said opposite edge portion of said panel in supported engagement with said flat surface.

16. In a fixture having means for registering said fixture to a programmable machine and means for registering and supporting at least one mother panel of substrate material on said fixture for at least partial removal of at least one circuit board from said panel, said removal being performed by a router bit mounted on a spindle of said machine, and said spindle being moveable in X, Y, and Z relative to said panel along a routing path according to a program, the improvement comprising:
- a platform, said platform having a surface with an array of perforations therein;
- said mother panel to fixture registering and supporting means comprising tooling means, adjustably repositionable over a surface of said platform, for reconfiguring said fixture to various different mother panels requiring correspondingly different programs and routing paths, said tooling means comprising at least one tool post means for supporting said panel in parallel, spaced relation to said platform surface; and
- connecting means, receivable into said perforations, for connecting said tool post means selectably at different locations on said surface of said platform according to requirements for each panel to be processed;
- said connecting means further comprising:
  - a base adjustably attached to said tool post means and a screw receivable in said base and one of said perforations in said platform surface in order to clamp said base to said platform; and
  - said base having a slot means for adjusting movement of said tool post means along said base, said tool post means including a fastening device travelling within said slot means for fastening said tool post means to said base.

17. The improvement as in claim 16, and further comprising:
said tool post means having a tip means, selectably receivable in holes in said panel, for supporting said board and maintaining said board in location relative to said panel during and after said removal.

18. In a fixture having means for registering said fixture to a programmable machine and means for registering and supporting at least one mother panel of substrate material on said fixture for at least partial removal of at least one circuit board from said panel, said removal being performed by a router bit mounted on a spindle of said machine, and said spindle being moveable in X, Y, and Z relative to said panel along a routing path according to a program, the improvement comprising:
a platform;
said mother panel to fixture registering and supporting means comprising tooling means, adjustably repositionable over a surface of said platform, for reconfiguring said fixture to various different mother panels requiring correspondingly different programs and routing paths; and
at least three cones attached to one of said fixture and a table of said machine, said cones being engageable in corresponding registration holes in the other of said fixture and said table when mounting and registering said fixture on said table.

19. In a fixture having means for registering said fixture to a programmable machine and means for registering and supporting at least one mother panel of substrate material on said fixture for at least partial removal of at least one circuit board from said panel, said removal being performed by a router bit mounted on a spindle of said machine, and said spindle being moveable in X, Y, and Z relative to said panel along a routing path according to a program, the improvement comprising:
a platform;
said mother panel to fixture registering and supporting means comprising tooling means, adjustably repositionable over a surface of said platform, for reconfiguring said fixture to various different mother panels requiring correspondingly different programs and routing paths; and
means for registering and supporting auxiliary fixtures on said platform to effect said registering and supporting of mother panels on said fixture, each of said auxiliary fixtures being dedicated to registering and supporting a particular mother panel having a corresponding particular panel configuration.

20. The improvement as in claim 19, and said fixture comprising:
means for registering and supporting at least a substrate for an auxiliary fixture for at least partial fabrication of said auxiliary fixture on said machine, said auxiliary fixture being dedicated to registering and supporting a particular panel having a corresponding particular panel configuration.

21. The improvement as in claim 3 wherein said second tool post means further includes a bracket having said surface of said second tool post means, said bracket further including a slot therein for adjustably connecting said bracket to said second connecting means.

22. The improvement as in claim 2, wherein said second tool post means includes a tool support post for supporting a surface of said panel; and
said second connecting means including a bracket affixed to said tool support post, said bracket being radially and axially adjustably connected to one of said perforations for adjusting the position of said tool support post with respect to said one perforation.

23. The improvement as in claim 22 wherein said tool support post includes a conically shaped tip at the top of said tool support post for insertion into a hole in said panel.

* * * * *